(12) United States Patent
Kanba

(10) Patent No.: US 6,181,179 B1
(45) Date of Patent: Jan. 30, 2001

(54) SCAN FLIP-FLOP CIRCUIT

(75) Inventor: Kohji Kanba, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/333,579

(22) Filed: Jun. 15, 1999

(30) Foreign Application Priority Data

Jun. 17, 1998 (JP) .................................................. 10-169554

(51) Int. Cl.[7] .................................................. H03K 3/356
(52) U.S. Cl. ........................................... 327/202; 327/212
(58) Field of Search .................................... 327/202, 203, 327/199, 208, 210, 211, 212; 714/726, 731

(56) References Cited

U.S. PATENT DOCUMENTS

| | | | |
|---|---|---|---|
| 5,257,223 | * 10/1993 | Dervisoglu | 327/203 |
| 5,469,079 | * 11/1995 | Mahant-Shetti et al. | 327/203 |
| 5,689,517 | * 11/1997 | Ruparel | 714/731 |
| 6,006,348 | * 12/1999 | Sode et al. | 714/731 |

FOREIGN PATENT DOCUMENTS

| | | |
|---|---|---|
| 1-96573 | 4/1989 | (JP) . |
| 2-205109 | 8/1990 | (JP) . |
| 8-5710 | 1/1996 | (JP) . |
| 9-43314 | 2/1997 | (JP) . |
| 9-270677 | 10/1997 | (JP) . |

* cited by examiner

*Primary Examiner*—Toan Tran
(74) *Attorney, Agent, or Firm*—McGuireWoods LLP

(57) ABSTRACT

A scan flip-flop circuit includes first and second master latches, a slave latch, and first, second, and third switches. The first master latch latches a data input signal and outputs it to the first output terminal in normal operation. The second master latch latches a scan input signal and outputs it to the second output terminal in a scan test. The slave latch latches an output from the first master latch that is input to a first input terminal, thereby outputting it to a third output terminal in normal operation, and latches an output from the second master latch that is input to a second input terminal, thereby outputting it to the third output terminal in a scan test. The first switch disconnects the first output terminal of the first master latch from the first input terminal of the slave latch in a scan test. The second switch disconnects the first output terminal of the second master latch from the second input terminal of the slave latch in normal operation. The third switch connects the second output terminal of the second master latch to the first input terminal via the second input terminal of the slave latch upon ON operation in a scan test, and disconnects the second output terminal of the second master latch from the first input terminal of the slave latch upon OFF operation in normal operation.

9 Claims, 6 Drawing Sheets

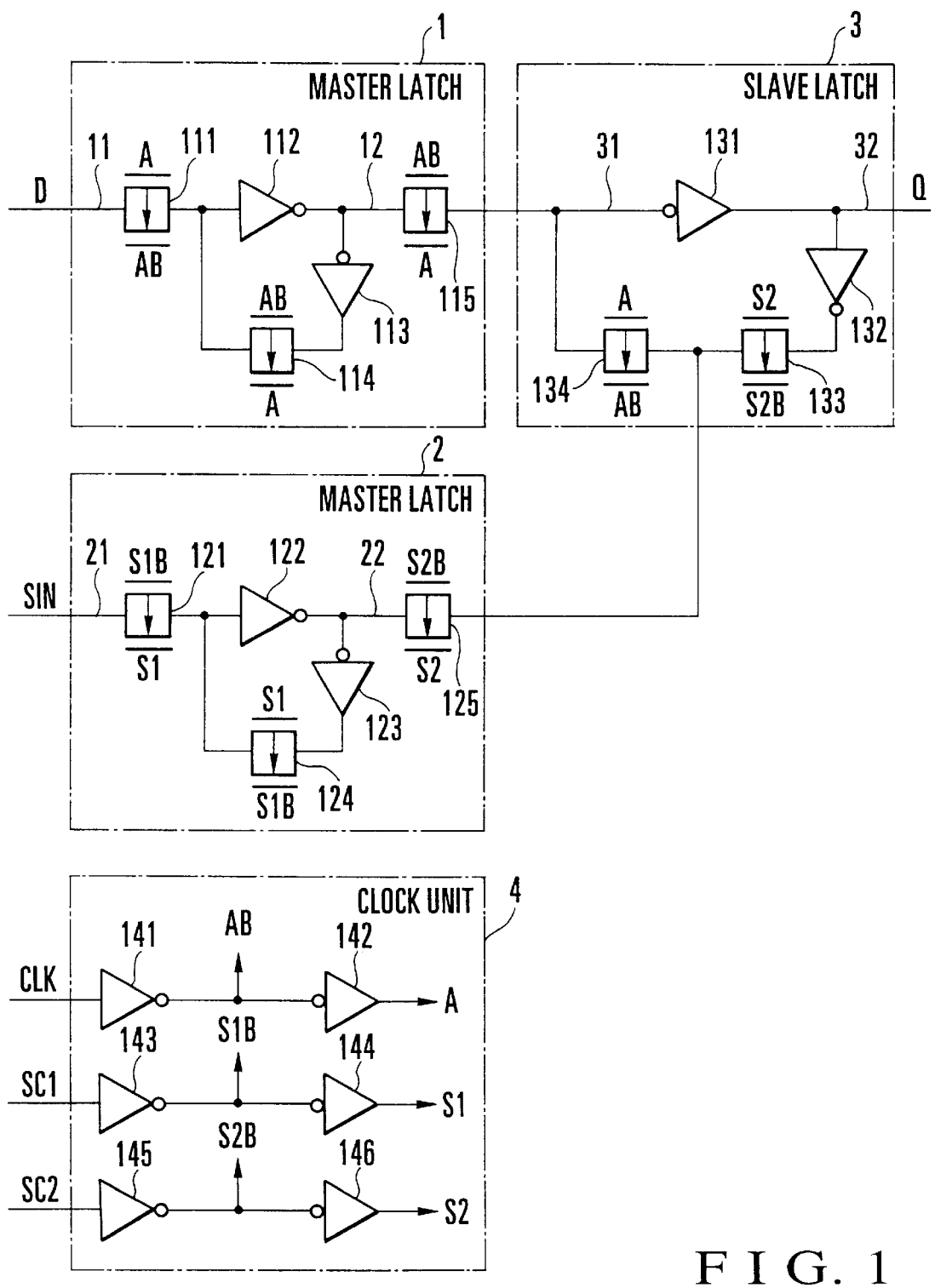
F I G. 1

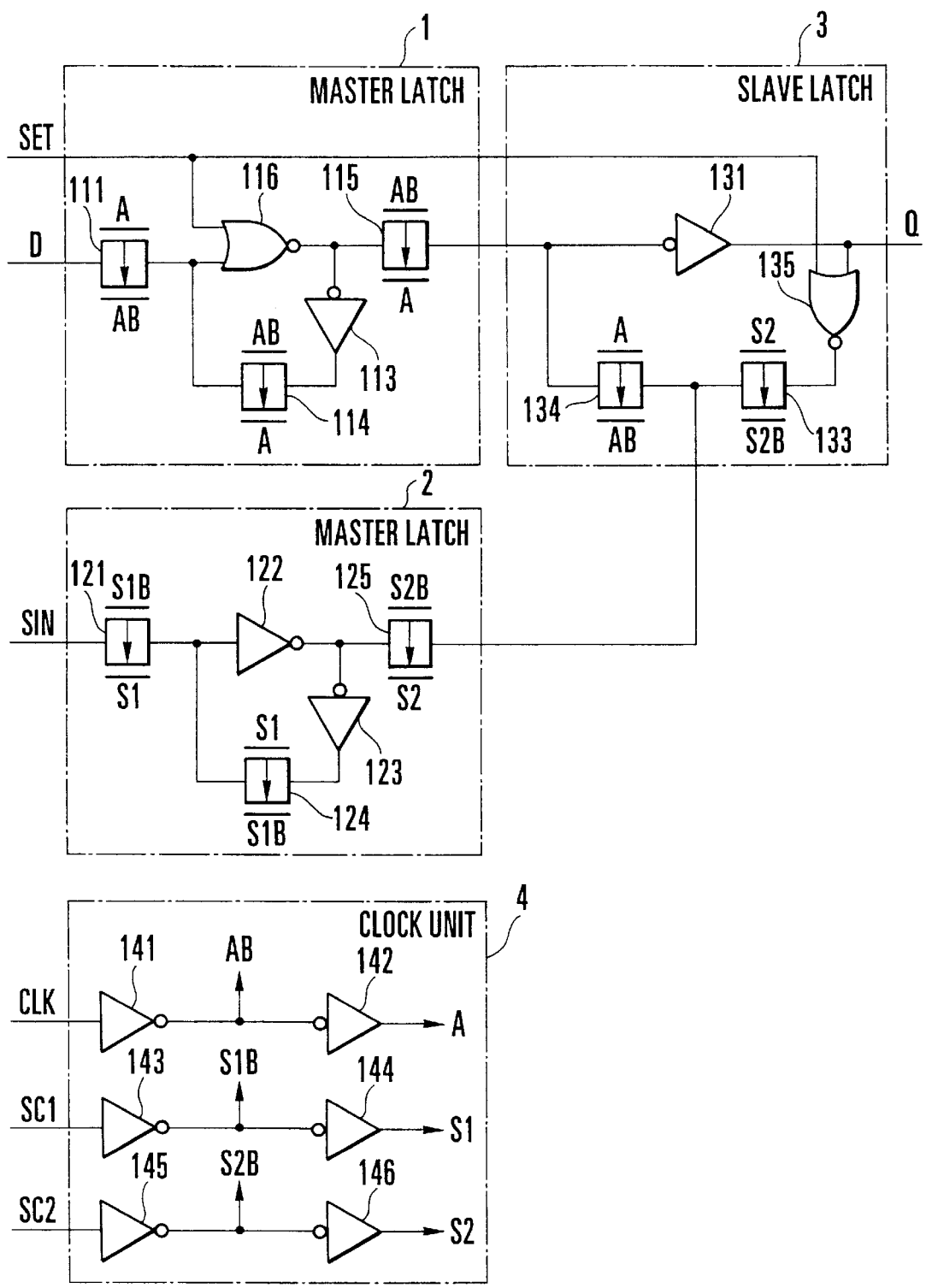
F I G. 4

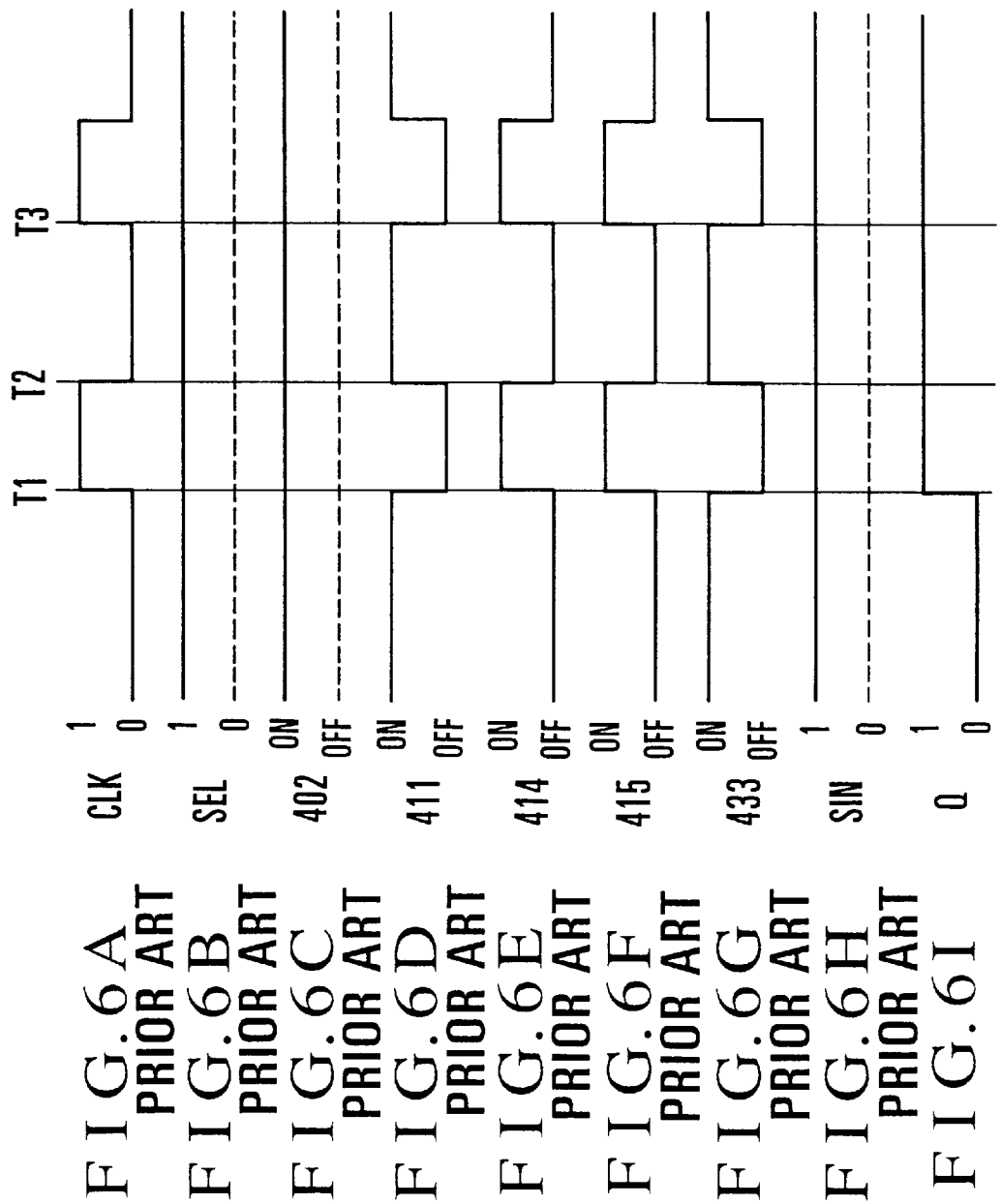

SCAN FLIP-FLOP CIRCUIT

BACKGROUND OF THE INVENTION

The present invention relates to a scan flip-flop circuit and, more particularly, to a scan flip-flop circuit used to perform a scan test for a semiconductor integrated circuit.

A scan test for detecting a fault of a semiconductor integrated circuit has used a scan flip-flop circuit, as disclosed in Japanese Patent Laid-Open No. 1-96573. FIG. 5 shows a conventional scan flip-flop circuit.

In FIG. 5, the scan flip-flop circuit comprises a selector 40 on the input stage, a master latch 41 for receiving an output from the selector 40, a slave latch 43 for receiving an output from the master latch 41, and a clock unit 44.

The selector 40 comprises a transmission gate 401 for enabling/disabling (on/off) an input signal D, and a transmission gate 402 for enabling/disabling an input signal SIN. The outputs of the transmission gates 401 and 402 are commonly connected to the subsequent master latch 41. The selector 40 selects either one of the data input signal D input as a normal logic signal in normal operation and the scan input signal SIN input as a scan logic signal in a scan test.

The clock unit 44 generates a signal for controlling each transmission gate formed at the corresponding portion in the scan flip-flop circuit on the basis of a clock signal CLK and control signal SEL. In the clock unit 44, the clock signal CLK is input to an inverter 441 to output the logically inverted signal as a clock signal AB. The clock signal AB is input to an inverter 442 to output the logically inverted signal as a clock signal A.

The control signal SEL is input to an inverter 443 to output the logically inverted signal as a control signal BB. The control signal BB is input to an inverter 444 to output the logically inverted signal as a control signal B.

In normal operation, the control signal SEL=0 (L level) is set to set the control signal BB=1 and the control signal B=0. Thus, the transmission gate 401 of the selector 40 is turned on to output the input signal D to the master latch 41.

In a scan test, the control signal SEL=1 (H level) is set to set the control signal BB=0 and the control signal B=1. Thus, the transmission gate 402 of the selector 40 is turned on to output the input signal SIN to the master latch 41.

The master latch 41 comprises a transmission gate 411 for enabling/disabling an output from the selector 40, and an inverter 412 for inverting and outputting an output from the transmission gate 411. An inverter 413 for inverting and outputting an output from the inverter 412, and a transmission gate 414 for connecting/disconnecting the output of the inverter 413 to/from the input of the inverter 412 are series-connected between the input and output of the inverter 412.

The inverters 412 and 413 and transmission gate 414 constitute a latch. An output from the inverter 412 is output to the subsequent slave latch 43 via a transmission gate 415.

The slave latch 43 comprises an inverter 431 for inverting and outputting an output from the master latch 41, an inverter 432 for inverting and outputting an output from the inverter 431, and a transmission gate 433 for connecting/disconnecting the output of the inverter 432 to/from the input of the inverter 431. The inverters 431 and 432 and transmission gate 433 constitute a latch, and an output from the slave latch 43 is output as an output signal Q.

Operation in a scan test will be explained with reference to FIGS. 6A to 6I.

In a scan test, the control signal SEL=0 (FIG. 6B) is set to turn on the transmission gate 402 (FIG. 6C). In this state, for a clock signal CLK=0, e.g., before time T1 (FIG. 6A), the clock signal AB=1 and the clock signal A=0 hold. In the master latch 41, the transmission gate 411 is turned on (FIG. 6D) to input the scan logic input signal SIN (FIG. 6H) from the selector 40 to the inverter 412.

At time T1, the clock signal CLK=1 is set to set the clock signal AB=0 and the clock signal A=1. Thus, the transmission gate 411 is turned off, and the transmission gate 414 is turned on (FIGS. 6D and 6E) to latch an output from the inverter 412.

At this time, the transmission gate 415 is also turned on (FIG. 6F) to input an output from the inverter 412 to the slave latch 43. Then, the inverter 431 outputs the inverted output as the output signal Q (FIG. 6I). At time T2, the clock signal CLK=0 is set to latch the output signal Q by the slave latch 43 (FIG. 6G).

The conventional scan flip-flop circuit comprises the selector 40 for selecting either one of the normal logic input signal D and scan logic input signal SIN by the external control signal SEL depending on normal operation or scan test. Even in normal operation, this selector 40 exists on the path of the normal logic input signal D to delay propagation of the input signal D, failing to operate the scan flip-flop circuit at a higher speed.

SUMMARY OF THE INVENTION

It is an object of the present invention to provide a scan flip-flop circuit having higher-speed operation characteristics in normal operation.

To achieve the above object, according to the present invention, there is provided a scan flip-flop circuit comprising a first master latch for latching a data input signal and outputting the data input signal to a first output terminal in a normal operation mode, a second master latch for latching a scan input signal and outputting the scan input signal to a second output terminal in a scan test mode, a slave latch for latching an output from the first master latch that is input to a first input terminal, thereby outputting the output to a third output terminal in the normal operation mode, and latching an output from the second master latch that is input to a second input terminal, thereby outputting the output to the third output terminal in the scan test mode, first switch means for disconnecting the first output terminal of the first master latch from the first input terminal of the slave latch in the scan test mode, second switch means for disconnecting the first output terminal of the second master latch from the second input terminal of the slave latch in the normal operation mode, and third switch means which is connected between the first and second input terminals of the slave latch, connects the second output terminal of the second master latch to the first input terminal via the second input terminal of the slave latch upon ON operation in the scan test mode, and disconnects the second output terminal of the second master latch from the first input terminal of the slave latch upon OFF operation in the normal operation mode.

BRIEF DESCRIPTION OF THE DRAWINGS

FIG. 1 is a block diagram showing a scan flip-flop circuit according to the first embodiment of the present invention;

FIG. 4 is a block diagram showing a scan flip-flop circuit according to the second embodiment of the present invention;

FIGS. 6A to 6I are timing charts showing scan test operation in the conventional scan flip-flop circuit.

DESCRIPTION OF THE PREFERRED EMBODIMENTS

Figure 2:
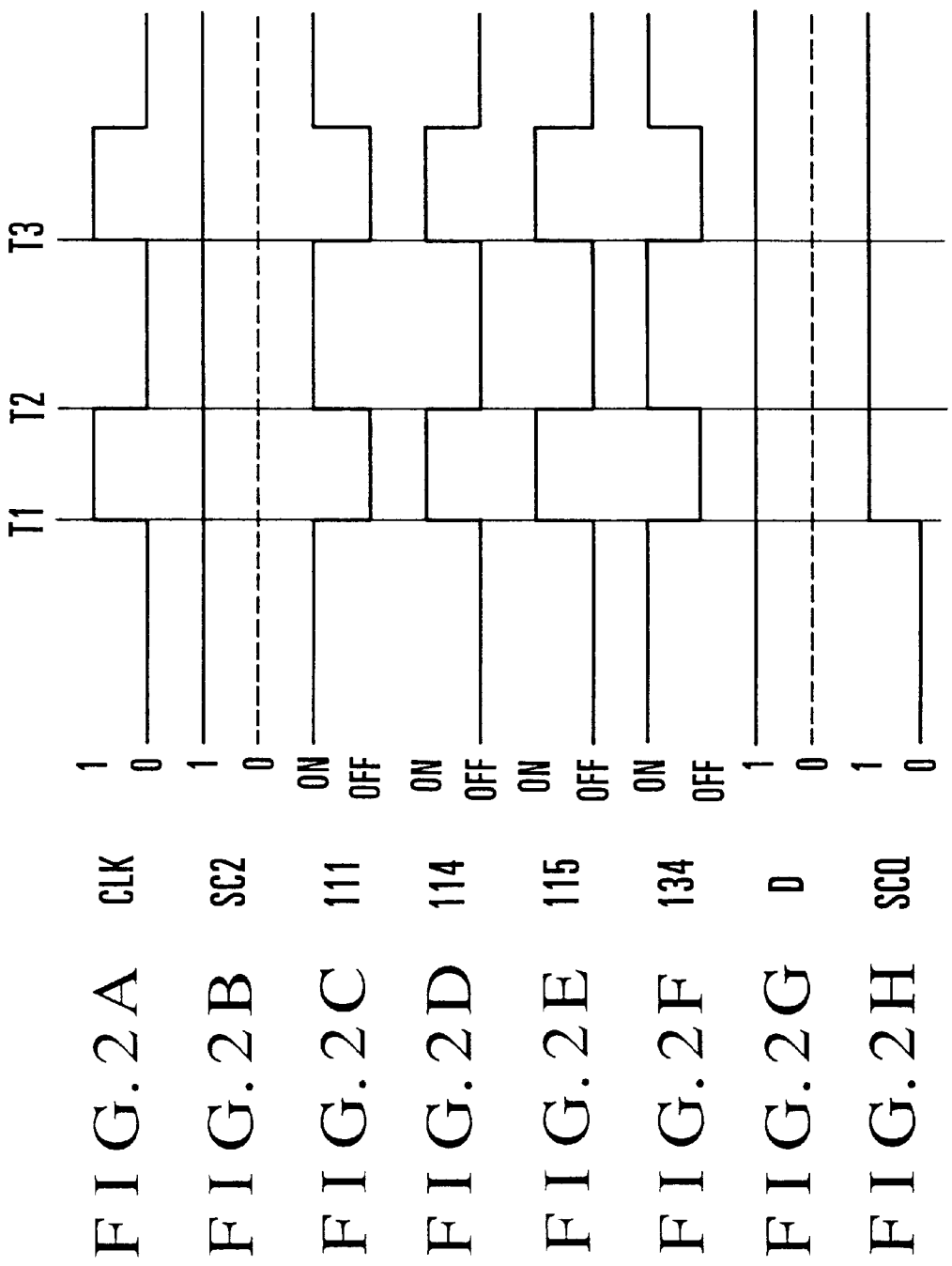
FIGS. 2A to 2H are timing charts showing normal operation in the scan flip-flop circuit in FIG. 1.

The present invention will be described in detail below with reference to the accompanying drawings.

FIG. 1 shows a scan flip-flop circuit according to the first embodiment of the present invention. In the first embodiment, a data input signal D in normal operation (normal operation mode) and a scan input signal SIN in a scan test (scan test mode) are separately latched by two parallel master latches. Outputs from these master latches are selected and latched by a slave latch so as not to cause any delay in normal operation.

In FIG. 1, the scan flip-flop circuit of the first embodiment comprises a master latch 1 for latching the input signal D from an input line 11 in normal operation, a master latch 2 for latching the input signal SIN input from an input line 21 in a scan test, a slave latch 3 for receiving outputs from the master latches 1 and 2, and a clock unit 4 for supplying a clock signal to the master latches 1 and 2 and slave latch 3.

The master latch 1 comprises a transmission gate 111 serving as an analog switch for enabling/disabling the input signal D, and an inverter 112 for inverting and outputting an output from the transmission gate 111. An inverter 113 for inverting and outputting an output from the inverter 112, and a transmission gate 114 for connecting/disconnecting the output of the inverter 113 to/from the input of the inverter 112 are series-connected between the input and output of the inverter 112. The inverters 112 and 113 and transmission gate 114 constitute a latch.

The output of the inverter 112 is connected as an output line 12 of the master latch 1 to an input line 31 of the subsequent slave latch 3 via a transmission gate 115.

The master latch 2 comprises transmission gates 121, 124, and 125 and inverters 122 and 123, and has the same arrangement as that of the master latch 1. That is, the transmission gates 111, 114, and 115 of the master latch 1 correspond to the transmission gates 121, 124, and 125 (second switch means) of the master latch 2, and the inverters 112 and 113, input line 11, and output line 12 of the master latch 1 correspond to the inverters 122 and 123, input line 21, and output line 22 of the master latch 2.

Note that the transmission gates 121, 124, and 125 of the master latch 2 operate at different timings from the transmission gates 111, 114, and 115 of the master latch 1.

The slave latch 3 comprises a series circuit made up of an inverter 131 for inverting and outputting an output from the master latch 1, an inverter 132 for inverting and outputting an output from the inverter 131, and transmission gates 133 and 134 for connecting/disconnecting the output of the inverter 132 to/from the input of the inverter 131. The node between the transmission gates 133 and 134 is connected to the output of the inverter 122 as the output line 22 of the master latch 2 via the transmission gate 125.

The inverters 131 and 132 and transmission gates 133 and 134 constitute a latch, and an output from the inverter 131 is output as an output signal Q.

The clock unit 4 generates a clock signal for controlling each transmission gate formed at a portion in the scan flip-flop circuit on the basis of the clock signals CLK, SC1, and SC2. In the clock unit 4, the clock signal CLK is input to an inverter 141 to output the logically inverted signal of the inverter 141 as a clock signal AB. The clock signal AB is input to an inverter 142 to output the logically inverted signal of the inverter 142 as a clock signal A.

The clock signal SC1 is input to an inverter 143 to output the logically inverted signal of the inverter 143 as a clock signal S1B. The clock signal S1B is input to an inverter 144 to output the logically inverted signal of the inverter 144 as a clock signal S1.

The clock signal SC2 is input to an inverter 145 to output the logically inverted signal of the inverter 145 as a clock signal S2B. The clock signal S2B is input to an inverter 146 to output the logically inverted signal of the inverter 146 as a clock signal S2.

As the transmission gates 111, 114, 115, 121, 124, 125, 133, and 134, CMOS (Complementary Metal Oxide Semiconductor) transmission gate switches in each of which p- and n-channel MOS transistors are parallel-connected to receive a control clock at their gates is used.

Normal operation of the scan flip-flop having this arrangement will be explained with reference to FIGS. 2A to 2H.

In normal operation, while the clock signal SC2 is held at "1 (H level)" (FIG. 2B), the clock signal CLK is enabled (FIG. 2A). For CLK=0 before time T1, the clock signal AB=1 and the clock signal A=0 from the clock unit 4 are set to turn on the transmission gate 111 (FIG. 2C). The input signal D (FIG. 2G) from the input line 11 is input to the inverter 112.

At this time, the transmission gate 115 is kept off (FIG. 2E) not to output any inverted output from the inverter 112 to the slave latch 3.

At time T1, CLK=1 is set to set AB=0 and A=1. Thus, the transmission gate 111 is turned off (FIG. 2C), and the transmission gate 114 is turned on (FIG. 2D) to latch an output from the inverter 112. At time T1, the transmission gate 115 is also turned on (FIG. 2E) to connect the output line 12 of the master latch 1 to the input line 31 of the slave latch 3. At this time, the transmission gate 134 is turned off (FIG. 2F) to disconnect the input line 31 of the slave latch 3 from the output line 22 of the master latch 2.

Hence, only the output from the inverter 112 is directly input to the inverter 131 via the transmission gate 115 to immediately output an inverted output from the inverter 131 as the output signal Q (FIG. 2H). At time T2, CLK=0 is set to turn on the transmission gate 134 (FIG. 2F).

In normal operation, since the clock signal SC2=1 always holds, the transmission gate 133 is kept on, and the transmission gate 125 of the master latch 2 is kept off. At time T2, therefore, the ON operation of the transmission gates 133 and 134 connects the output of the inverter 132 and the input of the inverter 131 to latch an output from the inverter 131.

From time T3 in normal operation, the input signal D is similarly received at the leading edge of the clock signal CLK, and latched and output by the master latch 1. A latch output Y is output as the output signal Q from the slave latch 3, and latched by the slave latch 3 at the trailing edge of the clock signal CLK.

Operation in a scan test will be explained with reference to FIGS. 3A to 3I.

Figure 3:
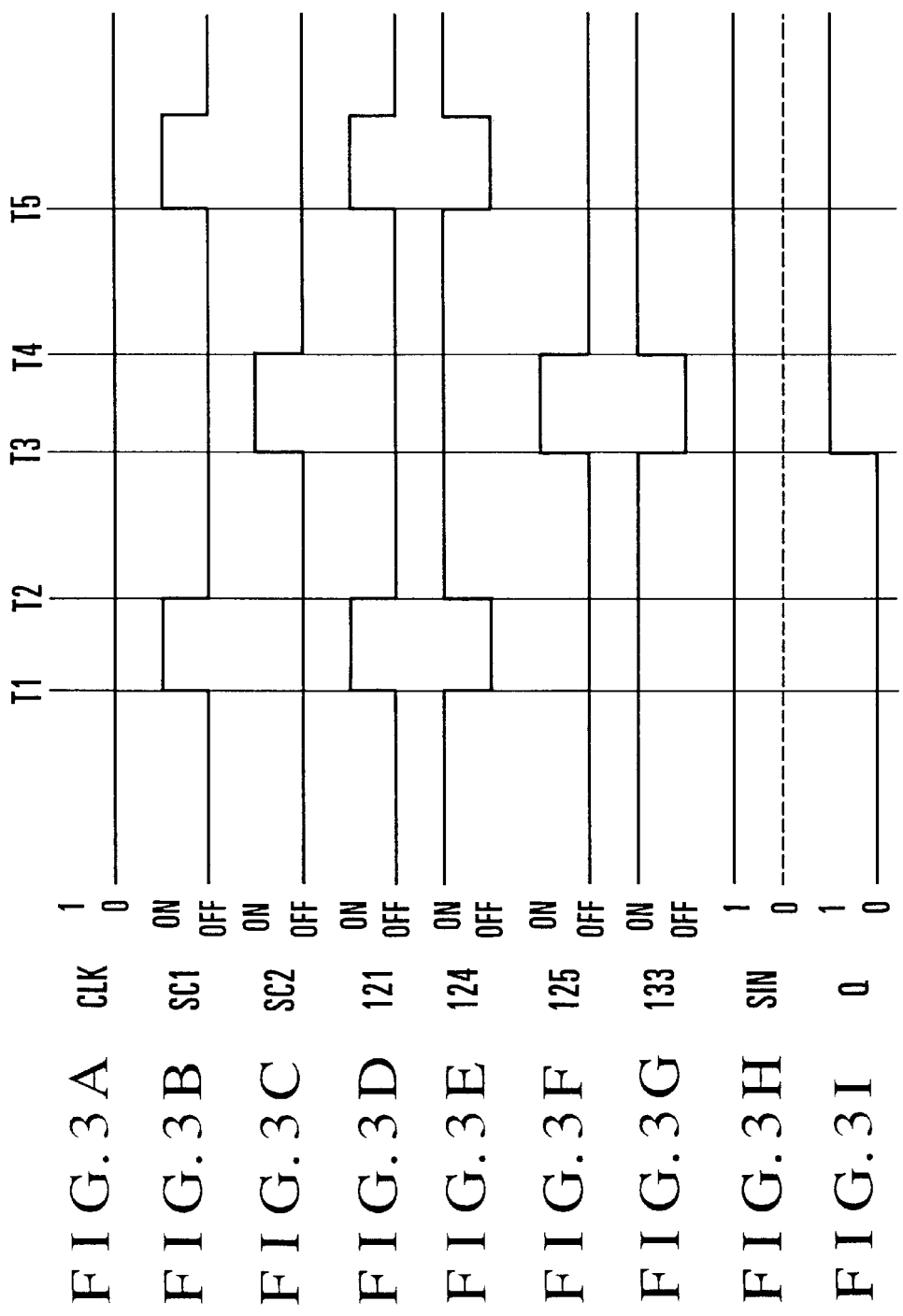
FIGS. 3A to 3I are timing charts showing scan test operation in the scan flip-flop circuit in FIG. 1.
Figure 5:
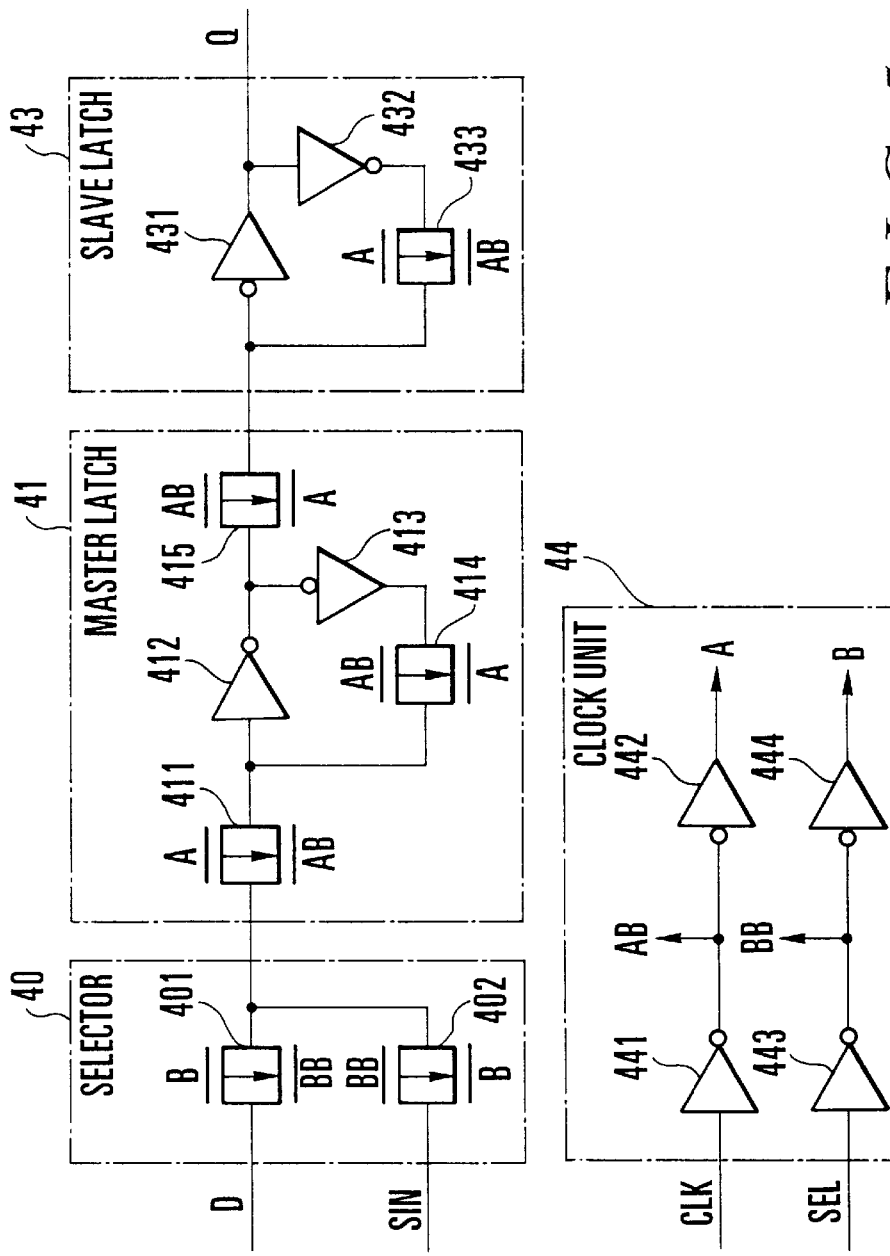
FIG. 5 is a block diagram showing a conventional scan flip-flop circuit.

In a scan test, while the clock signal CLK is held at "0 (L level)" (FIG. 3A), the clock signals SC1 and SC2 are enabled (FIGS. 3B and 3C).

At time T1, SC1=1 and SC2=0 are set to set S1B=0 and S1=1. Then, the transmission gate 121 of the master latch 2 is turned on (FIG. 3D) to input a test logic input signal SIN (FIG. 3H) to the inverter 122. At this time, since the clock signal SC2=0, S2B=1 and S2=0 hold, and the transmission gate 125 is turned off (FIG. 3F) not to output any inverted output from the inverter 122.

At time T2, SC1=0 and SC2=0 are set to set S1B=1 and S1=0. The transmission gate 121 is turned off (FIG. 3D), and the transmission gate 124 is turned on (FIG. 3E) to latch an output from the inverter 122.

At time T3, SC1=0 and SC2=1 are set to set S2B=0 and S2=1. The transmission gate 125 is turned on (FIG. 3F) to output an inverted output from the inverter 122 to the slave latch 3.

An output from the master latch 2 is supplied to the node between the transmission gates 133 and 134, i.e., the input of the transmission gate 134. Therefore, for SC2=1 at time T3, the output from the inverter 122 of the master latch 2 is input to the transmission gate 134 of the slave latch 3 via the transmission gate 125.

At this time, since the clock signal CLK=0 is maintained in a scan test, the clock signal AB=1 and A=0 hold, the transmission gate 115 on the output stage of the master latch 1 is kept off, and thus the output line 12 and input line 31 are disconnected from each other. On the other hand, the transmission gate 134 of the slave latch 3 is turned on to connect the output line 22 of the master latch 2 to the input line 31.

At time T3, an output from the master latch 2 is inverted by the inverter 131 and output as the output signal Q (FIG. 3I).

At time T4, SC2=0 is set to turn on the transmission gate 133 (FIG. 3G). Since the transmission gate 134 is ON at this time, an output from the inverter 131 is latched.

From time T5 in a scan test, the scan logic input signal SIN is received by the master latch 1 at the leading edge of the clock signal SC1, and latched and output at the trailing edge. The signal is received by the slave latch 3 at the leading edge of the clock signal SC2, output as the output signal Q, and latched at the trailing edge of the clock signal SC2.

In this manner, in the first embodiment, the master latch 1 for a normal logic input and the master latch 2 for a scan test logic input are independently arranged, and outputs from the master latches 1 and 2 are output via the common slave latch 3.

In normal operation, when an output from the master latch 1 is received by the slave latch 3, the transmission gate 134 of the slave latch 3 disconnects the output of the master latch 2 from the input line 31 serving as the path of the normal logic input signal D.

Accordingly, a selector, which causes a propagation delay, need not be arranged on the path of the normal logic input signal D, i.e., between the input line 11 and an output line 32, and higher-speed operation can be attained in normal operation.

In addition, the slave latch 3 comprises a switch means for disconnecting the output of the master latch 2 from the input line 31 serving as the path of the normal logic input signal D. This switch means can disconnect wiring extending from the master latch 2 to the slave latch 3, from the path of the normal logic input signal D, thereby suppressing a delay in output change of the output signal Q by the load capacitance.

Further, the transmission gate 134 for controlling latch operation in normal operation in the slave latch 3 also serves as a switch means for disconnecting the output of the master latch 2 from the input line 31 serving as the path of the input signal D. This can simplify the circuit arrangement while maintaining higher-speed operation characteristics in normal operation.

FIG. 4 shows a scan flip-flop circuit according to the second embodiment of the present invention.

The second embodiment adopts a setup function capable of setting the output states of a master latch and slave latch in accordance with a control signal SET.

In FIG. 4, 2-input NOR gates 116 and 135 replace the inverters 112 and 132 in FIG. 1. One input of each of the 2-input NOR gates 116 and 135 receives the control signal SET, and the other input receives a corresponding one of the outputs from the inverters 112 and 132. That is, for SET=0, the NOR gates 116 and 135 operate as the inverters 112 and 132 shown in FIG. 1.

For SET=1, outputs from the NOR gates 116 and 135 change to "0" to forcibly set the output signal Q=1. Circuit operations in normal operation and a scan test are the same as in FIG. 1, and a description thereof will be omitted.

For this reason, a selector for selecting either one of the input signal D and scan logic input signal SIN can be eliminated from the conventional scan flip-flop circuit. This can simplify the circuit realizing the setup function and shorten the time necessary for setup, i.e., the setup time.

As has been described above, the present invention does not require any selector on the path of the input signal D, i.e., between the input terminal and output terminal of the input signal D. Consequently, the propagation delay of the input signal D can be minimized to obtain higher-speed operation characteristics in normal operation.

What is claimed is:

1. A scan flip-flop circuit comprising:

a first master latch for latching a data input signal and outputting the data input signal to a first output terminal in a normal operation mode;

a second master latch for latching a scan input signal and outputting the scan input signal to a second output terminal in a scan test mode;

a slave latch for latching an output from said first master latch that is input to a first input terminal, thereby outputting the output to a third output terminal in the normal operation mode, and latching an output from said second master latch that is input to a second input terminal, thereby outputting the output to the third output terminal in the scan test mode, said slave latch comprising an OR logic circuit for logically ORing an output from said third output terminal with a SET signal for setting an output state of said slave latch;

first switch means for disconnecting the first output terminal of said first master latch from the first input terminal of said slave latch in the scan test mode;

second switch means for disconnecting the second output terminal of said second master latch from the second input terminal of said slave latch in the normal operation mode; and third switch means which is connected between the first and second input terminals of said slave latch, connects the second output terminal of said second master latch to the first input terminal via the second input terminal of said slave latch upon ON operation in the scan test mode, and disconnects the second output terminal of said second master latch from the first input terminal of said slave latch upon OFF operation in the normal operation mode.

2. A circuit according to claim 1, wherein said third switch means is kept off while the first output terminal of said first master latch is connected to the first input terminal of said slave latch in the normal operation mode.

3. A circuit according to claim 1, wherein said third switch means is connected to a feedback path in said slave latch for feeding back a signal output to the third output terminal of said slave latch to the first input terminal via the second input terminal, in the normal operation mode, said third switch means is turned off when an output from said first master latch is received by said slave latch, and turned on when the received signal is latched, and in the scan test mode, said third switch means is always kept on to supply an output from said second master latch that is input to the second input terminal of said slave latch to the first input terminal of said slave latch.

4. A circuit according to claim 1, wherein said slave latch comprises:

first logic means for logically inverting an input signal at the first input terminal and outputting the inverted signal to the third output terminal;

second logic means for logically inverting an output signal from said first logic means;

fourth switch means for receiving an output signal from said second logic means; and said third switch means for commonly receiving an output signal from said fourth switch means and an output signal from said second master latch via the second input terminal, and supplying an output signal to an input of said first logic means, said fourth switch means is always kept on in the scan test mode, and in the normal operation mode, is turned off when an output signal from said first master latch is received, and turned on when the received signal is latched, and said third switch means is always kept on in the normal operation mode, and in the scan test mode, is turned off when an output signal from said second master latch is received, and turned on when the received signal is latched.

5. A circuit according to claim 4, wherein said first and second logic means comprise inverters.

6. A scan flip-flop circuit comprising:

a first master latch for latching a data input signal and outputting the data input signal to a first output terminal in a normal operation mode;

a second master latch for latching a scan input signal and outputting the scan input signal to a second output terminal in a scan test mode;

a slave latch for latching an output from said first master latch that is input to a first input terminal, thereby outputting the output to a third output terminal in the normal operation mode, and latching an output from said second master latch that is input to a second input terminal, thereby outputting the output to the third output terminal in the scan test mode;

first switch means for disconnecting the first output terminal of said first master latch from the first input terminal of said slave latch in the scan test mode;

second switch means for disconnecting the second output terminal of said second master latch from the second input terminal of said slave latch in the normal operation mode; and third switch means which is connected between the first and second input terminals of said slave latch, connects the second output terminal of said second master latch to the first input terminal via the second input terminal of said slave latch upon ON operation in the scan test mode, and disconnects the second output terminal of said second master latch from the first input terminal of said slave latch upon OFF operation in the normal operation mode, wherein said slave latch comprises:

first logic means for logically inverting an input signal at the first input terminal and outputting the inverted signal to the third output terminal;

second logic means for logically inverting an output signal from said first logic means;

fourth switch means for receiving an output signal from said second logic means; and said third switch means for commonly receiving an output signal from said fourth switch means and an output signal from said second master latch via the second input terminal, and supplying an output signal to an input of said first logic means, said fourth switch means is always kept on in the scan test mode, and in the normal operation mode, is turned off when an output signal from said first master latch is received, and turned on when the received signal is latched, and said third switch means is always kept on in the normal operation mode, and in the scan test mode, is turned off when an output signal from said second master latch is received, and turned on when the received signal is latched, wherein said first logic means comprises an inverter, and said second logic means comprises an OR circuit for receiving an output from the inverter and a control signal for setting an output state of said slave latch.

7. A circuit according to claim 1, further comprising a clock unit for supplying a plurality of clock signals to said slave latch and said first and second master latches.

8. A circuit according to claim 1, wherein said first switch means in said first master latch, said second switch means in said second master latch, and said third switch means in said slave latch comprise CMOS (Complementary Metal Oxide Semiconductor) transmission gates.

9. A scan flip-flop circuit comprising:

a first master latch for latching a data input signal and outputting the data input signal to a first output terminal in a normal operation mode;

a second master latch for latching a scan input signal and outputting the scan input signal to a second output terminal in a scan test mode;

a slave latch for latching an output from said first master latch that is input to a first input terminal, thereby outputting the output to a third output terminal in the normal operation mode, and latching an output from said second master latch that is input to a second input terminal, thereby outputting the output to the third output terminal in the scan test mode, said slave latch comprising an OR logic circuit for logically ORing an output from said third output terminal with a SET signal for setting an output state of said slave latch;

first switch means for disconnecting the first output terminal of said first master latch from the first input terminal of said slave latch in the scan test mode;

second switch means for disconnecting the second output terminal of said second master latch from the second input terminal of said slave latch in the normal operation mode;

third switch means which is connected between the first and second input terminals of said slave latch, connects the second output terminal of said second master latch to the first input terminal via the second input terminal of said slave latch upon ON operation in the scan test mode, and disconnects the second output terminal of said second master latch from the first input terminal of said slave latch upon OFF operation in the normal operation mode;

a clock unit for supplying a plurality of pairs of logically inverted clock signals to said first, second, and third switch means, wherein said first, second, and third switch means comprise complementary metal oxide semiconductor (CMOS) transmission gates to which the pairs of logically inverted clock signals are supplied from said clock unit, respectively.

* * * * *